(12) United States Patent
Lee et al.

(10) Patent No.: US 11,330,731 B2
(45) Date of Patent: May 10, 2022

(54) MEMORY CARD SOCKET AND ELECTRONIC APPARATUS

(71) Applicant: SAMSUNG ELECTRONICS CO., LTD., Suwon-si (KR)

(72) Inventors: In-Jae Lee, Seoul (KR); Sang Sub Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/036,294

(22) Filed: Sep. 29, 2020

(65) Prior Publication Data

US 2021/0259122 A1 Aug. 19, 2021

(30) Foreign Application Priority Data

Feb. 18, 2020 (KR) .................... 10-2020-0019590

(51) Int. Cl.
| | |
|---|---|
| *H05K 7/02* | (2006.01) |
| *H05K 7/04* | (2006.01) |
| *H05K 5/02* | (2006.01) |
| *G06K 7/00* | (2006.01) |

(52) U.S. Cl.
CPC ......... *H05K 5/0286* (2013.01); *H05K 5/0226* (2013.01); *G06K 7/0056* (2013.01)

(58) Field of Classification Search
USPC ........................................................ 361/807
See application file for complete search history.

(56) References Cited

U.S. PATENT DOCUMENTS

| | | | | |
|---|---|---|---|---|
| 5,763,824 | A | * | 6/1998 | King ..................... H01L 23/552 174/374 |
| 6,303,854 | B1 | * | 10/2001 | Papaleo ............... H05K 9/0015 174/382 |
| 7,310,692 | B2 | | 12/2007 | Miller et al. |
| 7,359,204 | B1 | | 4/2008 | Jang et al. |
| 7,632,151 | B2 | | 12/2009 | Wang et al. |
| 2001/0049214 | A1 | * | 12/2001 | Billman ............. H01R 13/6583 439/138 |
| 2006/0046567 | A1 | * | 3/2006 | Ho ....................... H01R 12/716 439/607.01 |
| 2006/0278721 | A1 | | 12/2006 | Liu |

FOREIGN PATENT DOCUMENTS

| | | |
|---|---|---|
| JP | 5181400 B2 | 4/2013 |
| KR | 10-2007-0098313 A | 10/2007 |
| KR | 10-1012891 B1 | 2/2011 |
| KR | 10-2012-0013509 A | 2/2012 |

* cited by examiner

*Primary Examiner* — Hung S. Bui
(74) *Attorney, Agent, or Firm* — Sughrue Mion, PLLC

(57) ABSTRACT

An electric apparatus includes a substrate having a ground pattern on a top surface of the substrate; a conductive housing on the ground pattern and having an insertion space; a conductive connector disposed between the ground pattern and the conductive housing and connected to the ground pattern and the conductive housing, wherein the conductive housing is fixed to the substrate via the conductive connector; and a conductive cover coupled to the conductive housing, wherein the conductive cover is configured to move from a first position, at which the conductive cover externally opens the insertion space, to a second position, at which the conductive cover closes the insertion space.

19 Claims, 13 Drawing Sheets

MEMORY CARD SOCKET AND ELECTRONIC APPARATUS

CROSS-REFERENCE TO THE RELATED APPLICATION

This application is based on and claims priority under 35 U.S.C § 119 to Korean Patent Application No. 10-2020-0019590 filed on Feb. 18, 2020 in the Korean Intellectual Property Office, the disclosure of which is hereby incorporated by reference in its entirety.

BACKGROUND

Embodiments of the present disclosure relate to an electronic apparatus, and more particularly, to a memory card socket.

With the development of techniques for storage media, various types of memory devices used for auxiliary storage for portable products such as mobile phones or digital cameras have recently been manufactured in the form of memory cards. The memory devices may be nonvolatile memory devices. For example, the memory card may include a compact flash memory, a multimedia card, and an SD card. With the trend toward large capacity, high integration, and fast operation, a memory card socket requires increased reliability.

SUMMARY

Some example embodiments of the present disclosure provide a memory card socket with enhanced reliability.

According to one or more embodiments, an electric apparatus is provided. The electric apparatus includes a substrate having a ground pattern on a top surface of the substrate; a conductive housing on the ground pattern and having an insertion space; a conductive connector disposed between the ground pattern and the conductive housing and connected to the ground pattern and the conductive housing, wherein the conductive housing is fixed to the substrate via the conductive connector; and a conductive cover coupled to the conductive housing, wherein the conductive cover is configured to move from a first position, at which the conductive cover externally opens the insertion space, to a second position, at which the conductive cover closes the insertion space.

According to one or more embodiments, a memory card socket is provided. The memory card socket includes a substrate including a ground pattern that includes a first part and a second part; a conductive housing on the substrate and having an insertion space; a conductive connector between a top surface of the first part of the ground pattern and a bottom surface of the conductive housing, the conductive connector coupled to the first part of the ground pattern and the bottom surface of the conductive housing; and a conductive cover coupled to the conductive housing, wherein the conductive cover is configured to move from a first position to a second position, at which the conductive cover closes the insertion space, the second position being different from the first position, and wherein the conductive connector includes a solder material.

According to one or more embodiments, a memory card socket is provided. The memory card socket includes a substrate including a ground pattern on a top surface of the substrate; a conductive housing on the ground pattern and having an insertion space; a conductive connector provided between the ground pattern and the conductive housing and electrically connected to the ground pattern and the conductive housing; a conductive cover; a hinge coupled to the conductive housing and the conductive cover; and a connection terminal on the top surface of the substrate and exposed to the insertion space, wherein the connection terminal is electrically insulated from the ground pattern, wherein the conductive housing includes a body portion and a supporting portion, the supporting portion between the body portion and the substrate, and wherein the conductive connector is in contact with a bottom surface of the supporting portion. The conductive cover may be configured to move between a first position at which the conductive cover externally opens the insertion space; and a second position at which the conductive cover closes the insertion space, wherein the conductive cover, while at the second position, is in contact with a portion of the ground pattern.

DETAILED DESCRIPTION OF EMBODIMENTS

Figure 1:
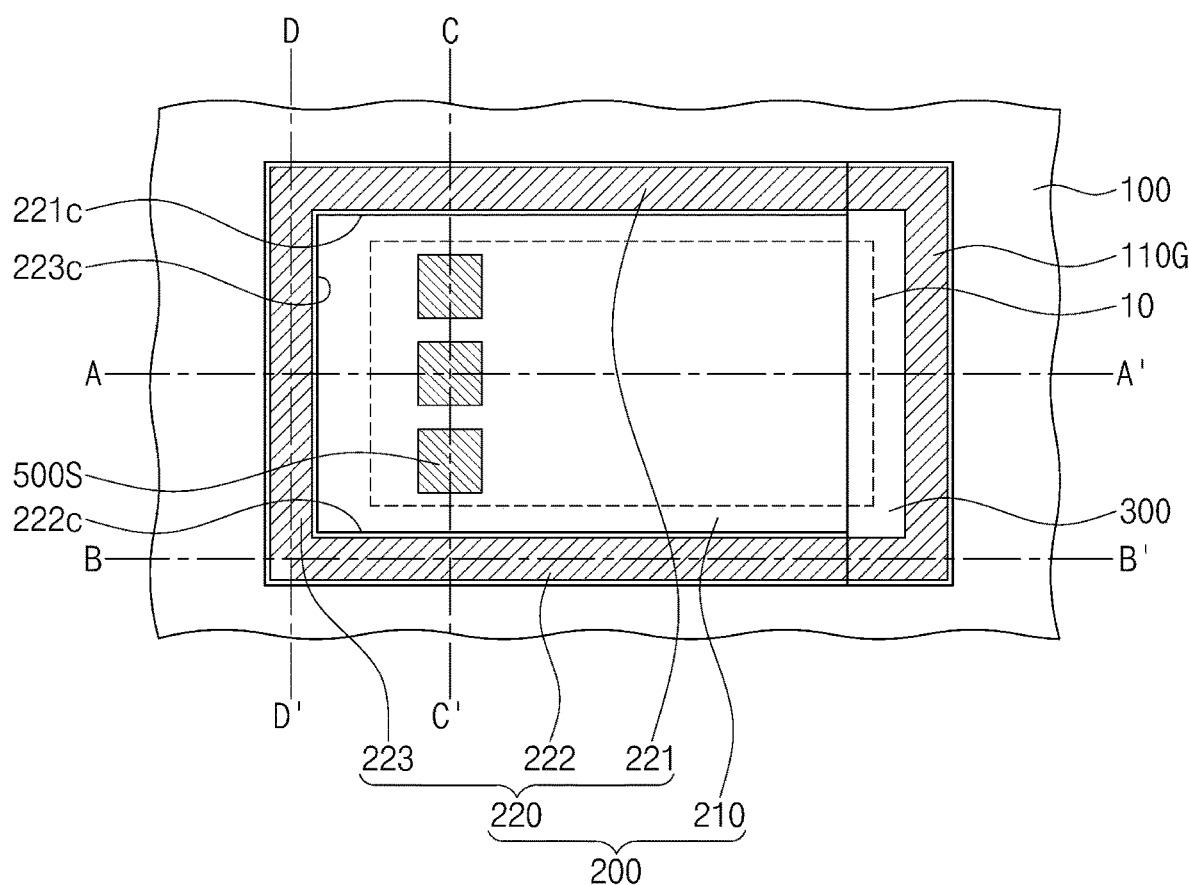
FIG. 1 illustrates a plan view showing an electronic apparatus according to some example embodiments.

In this description, like reference numerals may indicate like components. A connection between conductive elements may be interpreted to include an electrical connection and a physical connection. The following will now describe an electronic apparatus according to embodiments of the present disclosure.

Figure 2:
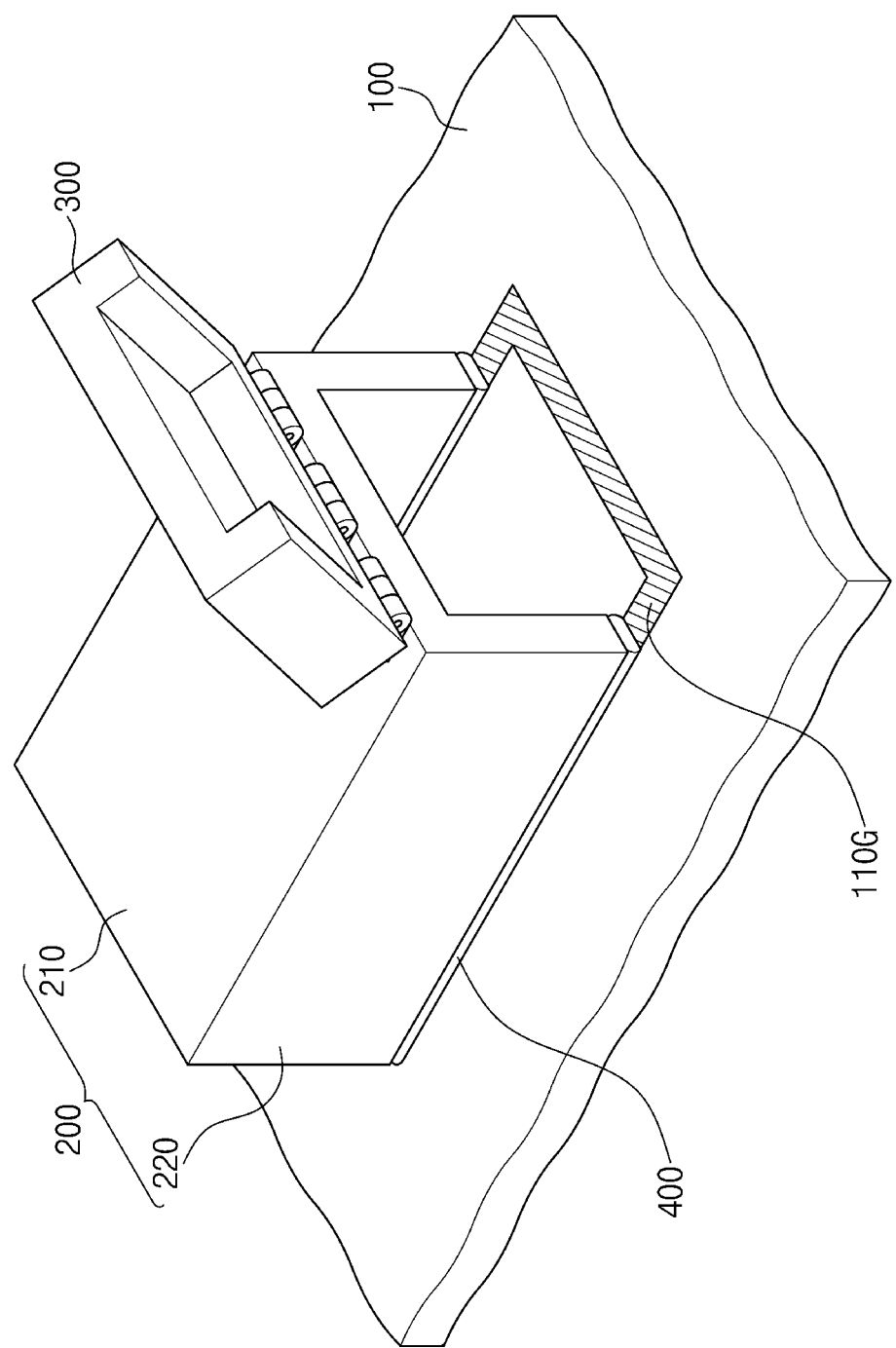
FIG. 2 illustrates a perspective view showing an electronic apparatus whose conductive cover is located at a first position according to some example embodiments.
Figure 3A:
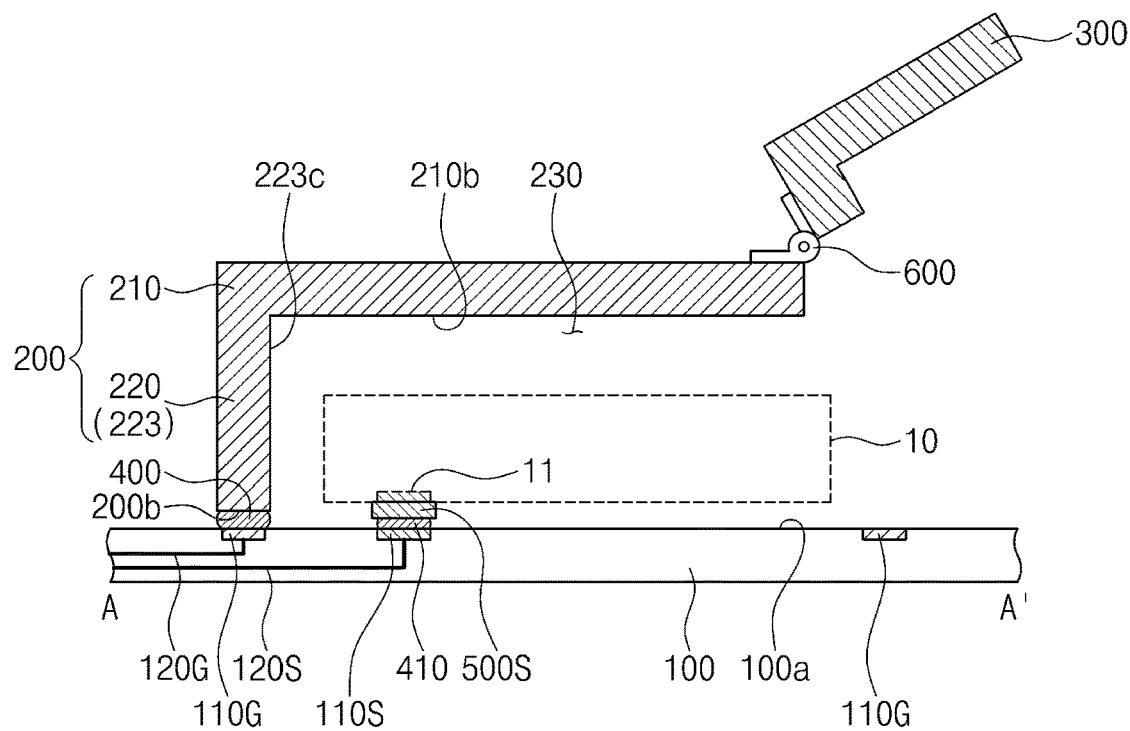
FIG. 3A illustrates a cross-sectional view taken along line A-A' of FIG. 1, showing an electronic apparatus whose conductive cover is located at a first position according to some example embodiments.
Figure 3B:
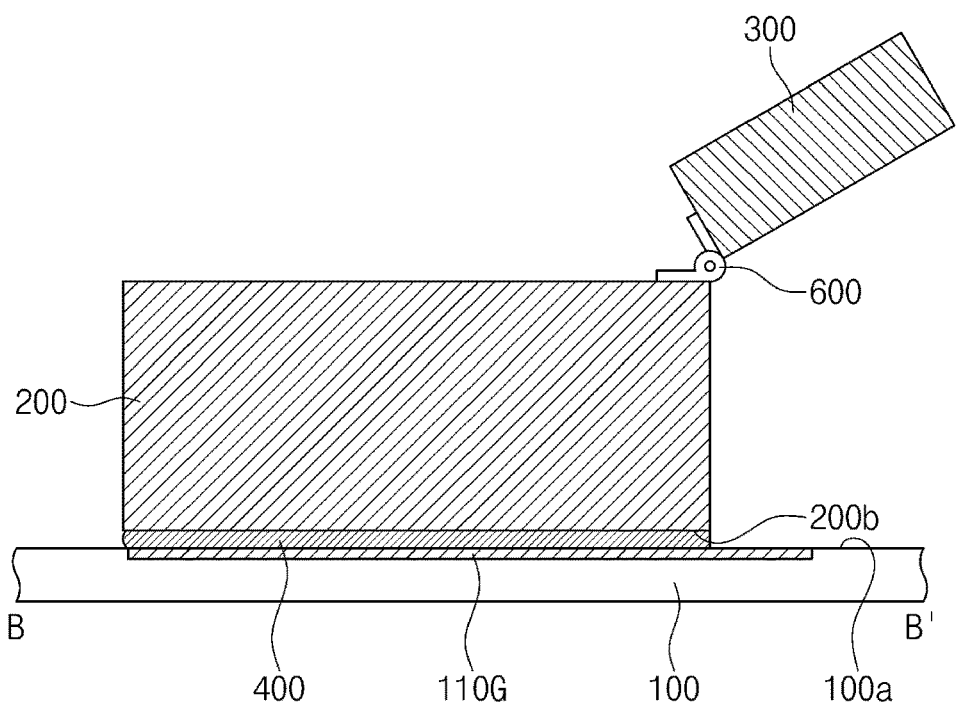
FIG. 3B illustrates a cross-sectional view taken along line B-B' of FIG. 1, showing an electronic apparatus whose conductive cover is located at a first position according to some example embodiments.
Figure 4:
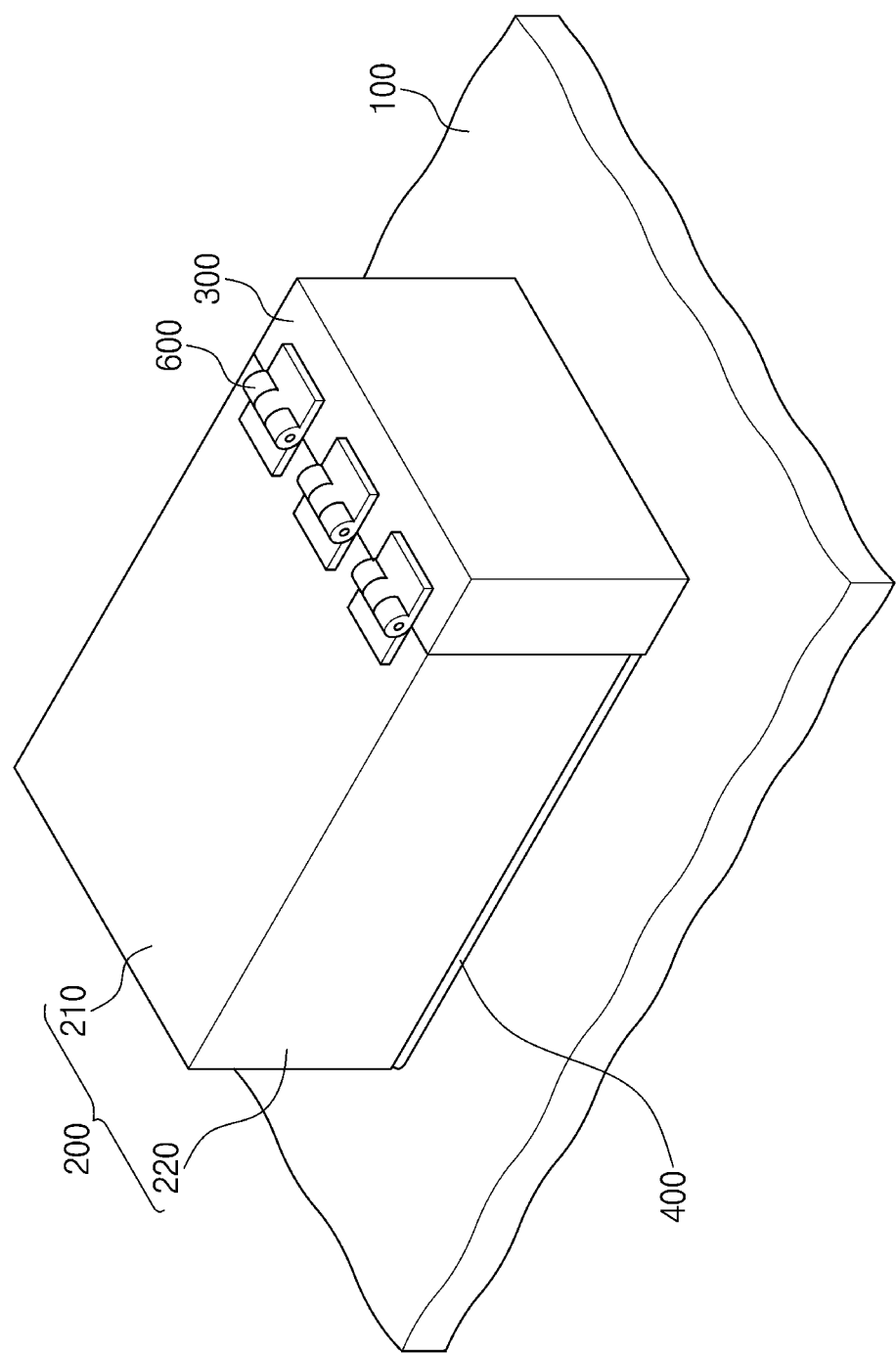
FIG. 4 illustrates a perspective view showing an electronic apparatus whose conductive cover is located at a second position according to some example embodiments.
Figure 5A:
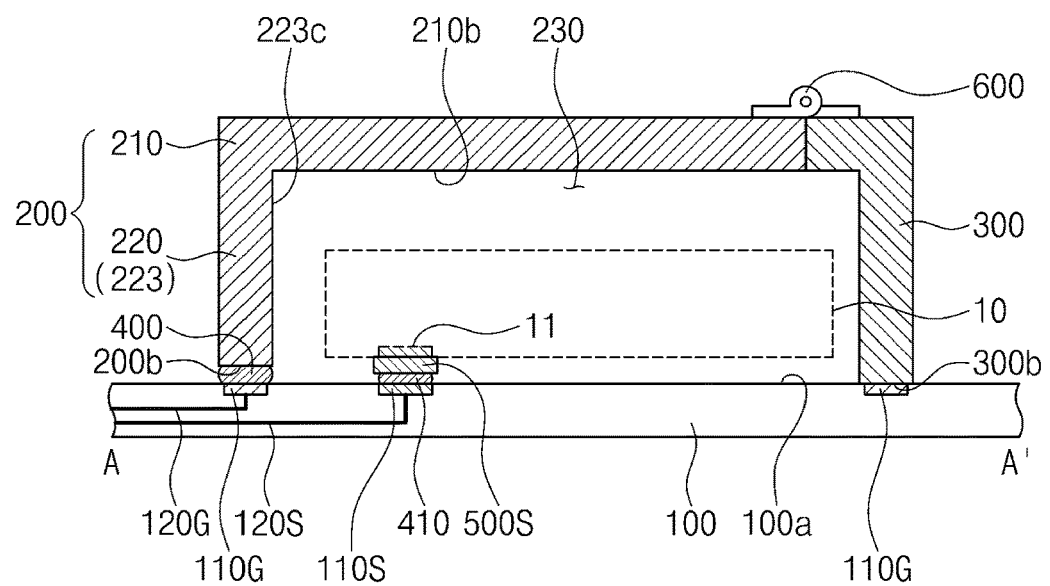
FIG. 5A illustrates a cross-sectional view taken along line A-A' of FIG. 1.
Figure 5B:
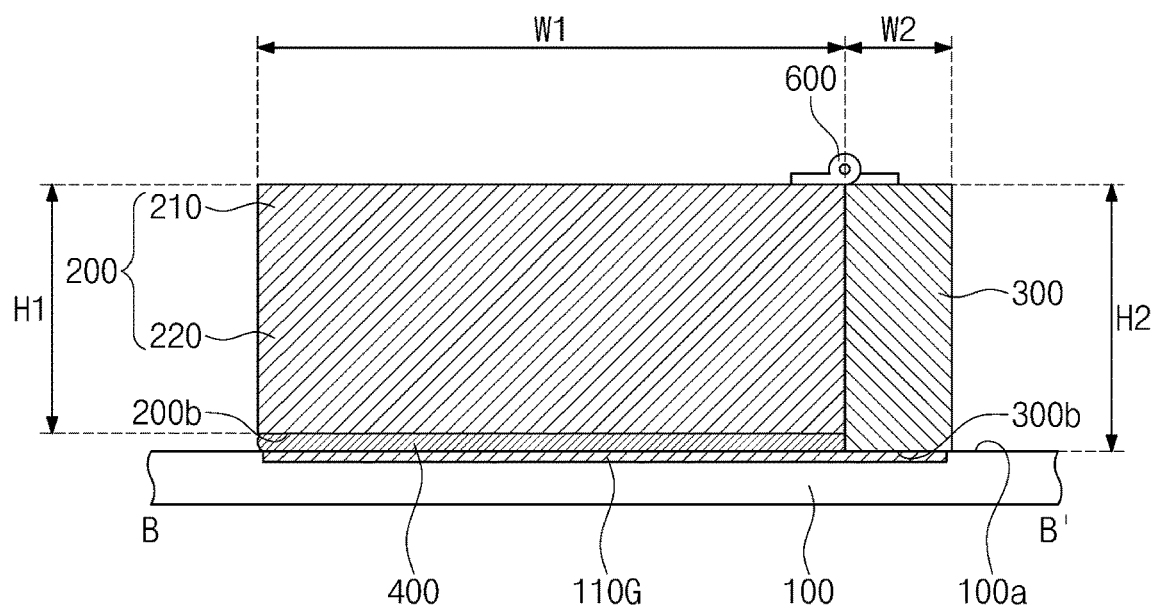
FIG. 5B illustrates a cross-sectional view taken along line B-B' of FIG. 1.
Figure 5C:
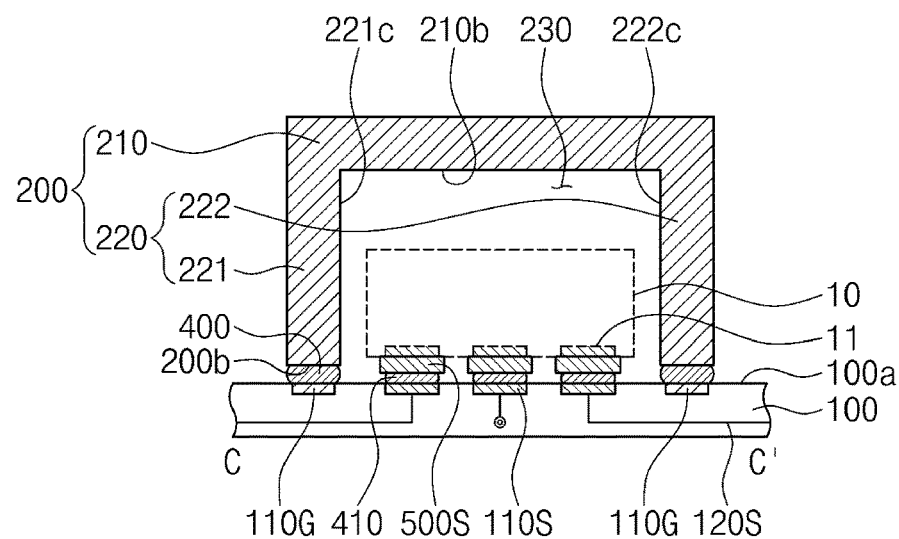
FIG. 5C illustrates a cross-sectional view taken along line C-C' of FIG. 1.
Figure 5D:
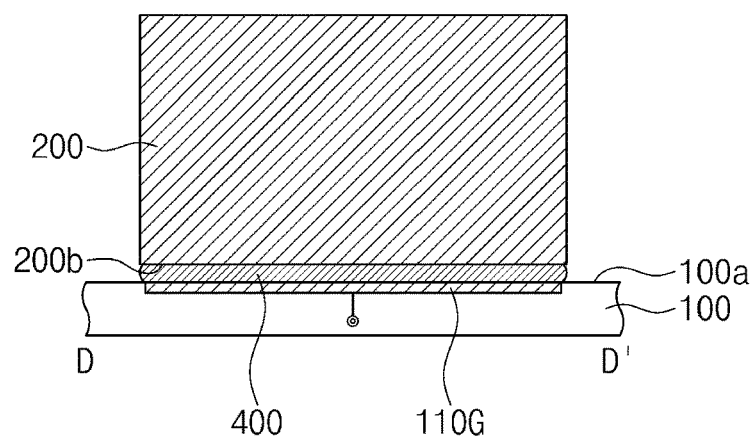
FIG. 5D illustrates a cross-sectional view taken along line D-D' of FIG. 1.

FIG. 1 illustrates a plan view showing an electronic apparatus according to some example embodiments. FIG. 2 illustrates a perspective view showing an electronic apparatus whose conductive cover is located at a first position according to some example embodiments. FIG. 3A illustrates a cross-sectional view taken along line A-A' of FIG. 1, showing an electronic apparatus whose conductive cover is located at a first position according to some example embodiments. FIG. 3B illustrates a cross-sectional view taken along line B-B' of FIG. 1, showing an electronic apparatus whose conductive cover is located at a first position according to some example embodiments. FIG. 4 illustrates a perspective view showing an electronic apparatus whose conductive cover is located at a second position according to some example embodiments. FIG. 5A illustrates a cross-sectional view taken along line A-A' of FIG. 1. FIG. 5B illustrates a cross-sectional view taken along line B-B' of FIG. 1. FIG. 5C illustrates a cross-sectional view taken along line C-C' of FIG. 1. FIG. 5D illustrates a cross-sectional view taken along line D-D' of FIG. 1. FIG. 1 shows an electronic apparatus whose conductive cover is located at a second position.

Referring to FIGS. 1, 2, 3A, 3B, 4, 5A, 5B, 5C, and 5D, an electronic apparatus may be a memory card socket. A memory card 10 may include, for example, a solid state disk (SSD). The electronic apparatus may include a substrate 100, a connection terminal 500S, a conductive housing 200, a conductive connector 400, and a conductive cover 300.

The substrate 100 may include a printed circuit board (PCB). The substrate 100 may include a ground pattern 110G, a signal pattern 110S, a ground line 120G, and a signal line 120S. The ground pattern 110G may be exposed on a top surface 100a of the substrate 100. The ground pattern 110G may have a closed loop shape or a closed polygonal shape when viewed in a plan view. The planar shape of the ground pattern 110G, however, is not limited thereto. For example, the ground pattern 110G may have an open loop shape or an open polygonal shape. The ground line 120G may be provided in the substrate 100 and be coupled to the ground pattern 110G. A ground terminal (not shown) may be disposed on either the top surface 100a or a bottom surface of the substrate 100 and be coupled to the ground line 120G. The ground terminal receives a ground voltage from an external apparatus. Therefore, the ground pattern 110G may be supplied with the ground voltage through the ground pattern 110G and the ground terminal.

As shown in FIGS. 3A, 5A, and 5C, the signal pattern 110S may be provided on the top surface 100a of the substrate 100. The signal pattern 110S may be spaced apart and electrically insulated from the ground pattern 110G. The signal line 120S may be provided in the substrate 100 and be coupled to the signal pattern 110S. A signal terminal (not shown) may be disposed on either the top surface 100a or the bottom surface of the substrate 100 and be coupled to the signal line 120S. The signal terminal may be configured to transceive an electrical signal with an external apparatus.

The connection terminal 500S may be provided on the top surface 100a of the substrate 100. For example, the connection terminal 500S may be disposed on a top surface of the signal pattern 110S. The conductive connector 410 may be provided between the signal pattern 110S and the connection terminal 500S. The conductive connector 410 may include a solder material. The conductive connector 410 may be coupled to the signal pattern 110S and the connection terminal 500S. Therefore, the connection terminal 500S may be electrically connected to the signal pattern 110S. The connection terminal 500S may be a coupling pin. The connection terminal 500S may serve as a signal connection terminal. For example, the connection terminal 500S may transceive an electrical signal with an external apparatus through the signal pattern 110S and the signal line 120S.

The conductive housing 200 may be disposed on the top surface 100a of the substrate 100. The conductive housing 200 may include a metallic material. The metallic material may include, for example, one or more of stainless steels, copper, and aluminum. In another example, the conductive housing 200 may include conductive oxide (e.g., transparent conductive oxide) or conductive carbon material (e.g., graphene).

The conductive housing 200 may have a body portion 210 and a supporting portion 220. When viewed in a plan view as shown in FIG. 1, the body portion 210 may overlap the connection terminal 500S. As shown in FIGS. 3A, 5A, and 5C, the body portion 210 may have a bottom surface 210b spaced apart from the top surface 100a of the substrate 100. The bottom surface 210b of the body portion 210 may be disposed spaced apart from the connection terminal 500S. An insertion space 230 may be provided between the body portion 210 and the connection terminal 500S. The conductive housing 200 may be electrically insulated from the connection terminal 500S.

The supporting portion 220 may be provided between the substrate 100 and the body portion 210. For example, the supporting portion 220 may be interposed between a top surface of the ground pattern 110G and an edge region of the body portion 210. When viewed in a plan view, the supporting portion 220 may overlap the ground pattern 110G. The supporting portion 220 may be spaced apart and electrically insulated from the connection terminal 500S. The supporting portion 220 and the body portion 210 may constitute a single unitary structure. For example, the supporting portion 220 may be connected to the body portion 210 without a boundary therebetween and may include the same material as that of the body portion 210. As shown in FIG. 1, the supporting portion 220 may include a first supporting portion 221, a second supporting portion 222, and a third supporting portion 223. The first supporting portion 221 may have a first inner sidewall 221c that faces a second inner sidewall 222c of the second supporting portion 222. The third supporting portion 223 may have a third inner sidewall 223c, and the third inner sidewall 223c may neighbor the first inner sidewall 221c and the second inner sidewall 222c. The third supporting portion 223 may be connected to the first and second supporting portions 221 and 222 without boundaries therebetween. When viewed in a plan view, each of the first, second, and third supporting portions 221, 222, and 223 may overlap the ground pattern 110G.

As shown in FIGS. 3A, 3B, 5A, 5B, 5C, and 5D, the conductive connector 400 may be disposed between the ground pattern 110G and the conductive housing 200. The conductive connector 400 may fix the conductive housing 200 to the substrate 100. The conductive connector 400 may be in contact with the top surface of the ground pattern 110G and a bottom surface 200b of the conductive housing 200. The bottom surface 200b of the conductive housing 200 may correspond to a bottom surface of the supporting portion 220. For example, the first, second, and third supporting portions 221, 222, and 223 may each have their bottom surface in contact with the conductive connector 400. The conductive connector 400 may fill a gap between the top surface of the ground pattern 110G and the bottom surface 200b of the conductive housing 200, and thus neither holes nor voids may be formed between the substrate 100 and the conductive housing 200. The conductive connector 400 may include a solder material. The solder material may include, for example, one or more of tin, silver, bismuth, and any alloy thereof. The conductive connector 400 may be electrically connected to the ground pattern 110G and the conductive housing 200. Therefore, a ground voltage may be applied to the conductive housing 200 through the ground pattern 110G and the conductive connector 400.

The conductive housing 200 may have the insertion space 230. The insertion space 230 may receive the memory card 10. In FIGS. 1, 3A, 5A, and 5C, a dotted line virtually represents the memory card 10 inserted into the conductive housing 200. The insertion space 230 may be defined by the substrate 100 and the conductive housing 200. For example, as shown in FIGS. 3A, 5A, and 5C, the insertion space 230 may be provided between the top surface 100a of the substrate 100, the bottom surface 210b of the body portion 210 of the conductive housing 200, the first inner sidewall 221c of the first supporting portion 221, the second inner sidewall 222c of the second supporting portion 222, and the third inner sidewall 223c of the third supporting portion 223. The insertion space 230 may be filled with air.

The memory card 10 may include a card terminal 11 disposed on one surface thereof. The card terminal 11 may be electrically connected to integrated circuits (not shown) in the memory card 10. The insertion of the memory card 10 may include allowing the insertion space 230 to receive the memory card 10 to couple the card terminal 11 to the connection terminal 500S. The memory card 10 may be electrically connected to an external apparatus though the connection terminal 500S and the substrate 100. For example, the integrated circuits of the memory card 10 may transceive an electrical signal with an external apparatus (not shown) through the connection terminal 500S, the signal pattern 110S, and the signal line 120S. In this description, the phrase "electrically connected to the substrate 100" may mean "electrically connected to the signal line 120S or the ground line 120G."

As the memory card 10 operates inside the insertion space 230 of the conductive housing 200, the conductive housing 200 may shield electromagnetic interference (EMI) of the memory card 10 or of an adjacent other apparatus. The electromagnetic interference may mean that communication operations of electrical components suffer from disturbance caused by electromagnetic waves emitted or transmitted from other electrical components. According to some example embodiments, the conductive housing 200 may prevent the memory card 10 from disturbing or being disturbed by operation of another apparatus. The other apparatus may include one or more of an electronic device, a semiconductor device, a semiconductor package, a passive device, and an active device, but embodiments of the present disclosure are not limited thereto. As a ground voltage is applied to the conductive housing 200, the memory card 10 may be efficiently shielded from electromagnetic interference.

When a hole is formed between the conductive housing 200 and the substrate 100, an electromagnetic wave may propagate through the hole. According to some example embodiments, the conductive connector 400 may prevent the formation of holes and/or gaps between the conductive housing 200 and the substrate 100. Therefore, the memory card 10 may be efficiently shielded from electromagnetic interference.

The conductive cover 300 may be coupled to the conductive housing 200. The conductive cover 300 may be configured to move between a first position and a second position. For example, the conductive cover 300 may move from the first position to the second position and vice versa.

As shown in FIGS. 2, 3A, and 3B, when the conductive cover 300 is located at the first position, the conductive cover 300 may externally open the insertion space 230. The conductive cover 300 at the first position may be spaced apart from the ground pattern 110G. When the conductive cover 300 is located at the first position, the memory card 10 may be loaded into or unloaded from the insertion space 230. The loading of the memory card 10 may mean that the memory card 10 is provided into the insertion space 230 and is electrically connected to the connection terminal 500S. When the memory card 10 is loaded into the insertion space 230, the conductive cover 300 may move from the first position to the second position, as shown in FIGS. 4, 5A, and 5B. When the conductive cover 300 is located at the second position, the conductive cover 300 may close the insertion space 230. The closure of the insertion space 230 may mean that the insertion space 230 is separated from an external space. The conductive cover 300 at the second position may face the third inner sidewall 223c of the third supporting portion 223 of the conductive housing 200. The memory card 10 may operate in a state where the conductive cover 300 is located at the second position. As the conductive cover 300 closes the insertion space 230, the memory card 10 may be efficiently shielded from electromagnetic interference.

When the conductive cover 300 is located at the second position, a bottom surface 300b of the conductive cover 300 may be placed at a lower level than that of the bottom surface 200b of the conductive housing 200. Therefore, the conductive cover 300 at the second position may be in contact with and electrically connected to the ground pattern 110G. For example, the bottom surface 300b of the conductive cover 300 may contact the ground pattern 110G. When the conductive cover 300 is located at the second position, a difference in level between the bottom surface 300b of the conductive cover 300 and the bottom surface 200b of the conductive housing 200 may be substantially the same as a height of the conductive connector 400. The difference in level between the bottom surface 300b of the conductive cover 300 at the second position and the bottom surface 200b of the conductive housing 200 may be in a range, for example, from about 0.0001 mm to about 0.1 mm. The difference in level may be measured in a direction perpendicular to the top surface 100a of the substrate 100.

According to some example embodiments, the ground pattern 110G may include a first part and a second part. When viewed in plan, the first part of the ground pattern 110G may overlap the supporting portion 220 of the conductive housing 200. The second part of the ground pattern 110G may be spaced apart from the conductive housing 200. When the conductive cover 300 is located at the second position, the conductive cover 300 may contact the second part of the ground pattern 110G. A ground voltage may be applied through the ground pattern 110G to the conductive cover 300. The conductive cover 300 may satisfactorily shield electromagnetic waves of the memory card 10. The memory card 10 may increase in reliability of operation. Alternatively, the conductive cover 300 at the second position may not contact the ground pattern 110G. In this case, a ground voltage may be applied through the conductive housing 200 to the conductive cover 300.

According to some example embodiments, the operation of the memory card 10 may include reading data from and writing data to the memory card 10, and the data may be transmitted to and from an external apparatus. Even when the conductive cover 300 is located at the second position, the conductive cover 300 may not be in contact with the memory card 10, but may be spaced apart from the memory card 10.

When the memory card 10 completes its read or write operation, the conductive cover 300 may return to the first position from the second position, as shown in FIGS. 2, 3A, and 3B. When the conductive cover 300 is provided at the first position, the memory card 10 may be unloaded. The unloading of the memory card 10 may mean that the memory card 10 is electrically separated from the connection terminal 500S and is removed from the insertion space 230.

The conductive cover 300 may include a metallic material. Alternatively, the conductive cover 300 may include conductive oxide or conductive carbon material. A shape of the conductive cover 300 is not limited to that shown, but may be variously changed.

A hinge 600 may be coupled to the conductive cover 300 and the conductive housing 200. The hinge 600 may couple the conductive cover 300 to the conductive housing 200. For example, the hinge 600 may be disposed on a top surface of the body portion 210 and may extend onto either a top surface or an outer sidewall of the conductive housing 200. Differently from that shown, the hinge 600 may be disposed on and extend onto the outer sidewall of the conductive housing 200.

As shown in FIG. 5B, the conductive housing 200 may have a height H1 ranging from about 1 mm to about 3 mm. When the conductive cover 300 is located at the second position, the conductive cover 300 may have a height H2 ranging from about 1 mm to about 3 mm. The height H1 of the conductive housing 200 may be less than the height H2 of the conductive cover 300. For example, a value of about 15 mm to about 30 mm may be given as a sum of a width W1 of the conductive housing 200 and a width W2 of the conductive cover 300 at the second position. The width W1 of the conductive housing 200 may be greater than the width W2 of the conductive cover 300. Therefore, the conductive housing 200 may be stably fixed to the substrate 100, and the conductive cover 300 may be stably coupled to the conductive housing 200. However, there is no limitation imposed on the relationship between the width W1 of the conductive housing 200 and the width W2 of the conductive cover 300.

Figure 6A:
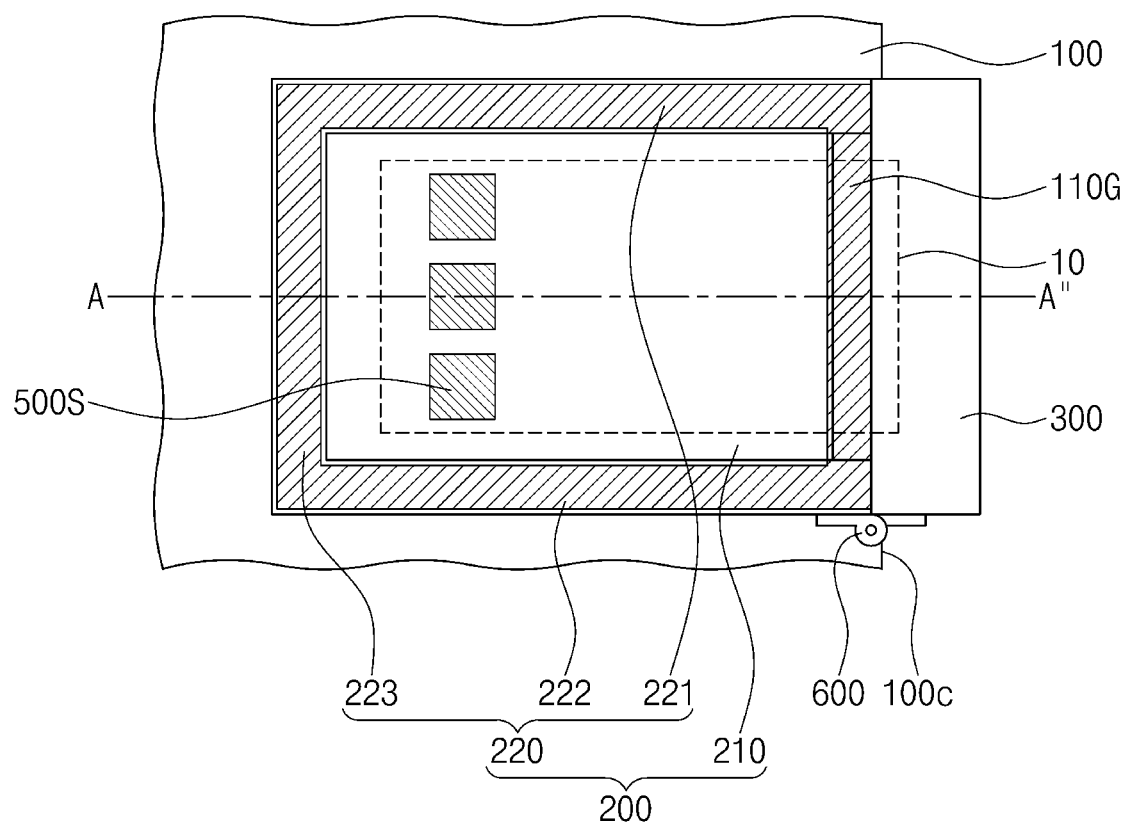
FIG. 6A illustrates a plan view showing an electronic apparatus according to some example embodiments.
Figure 6B:
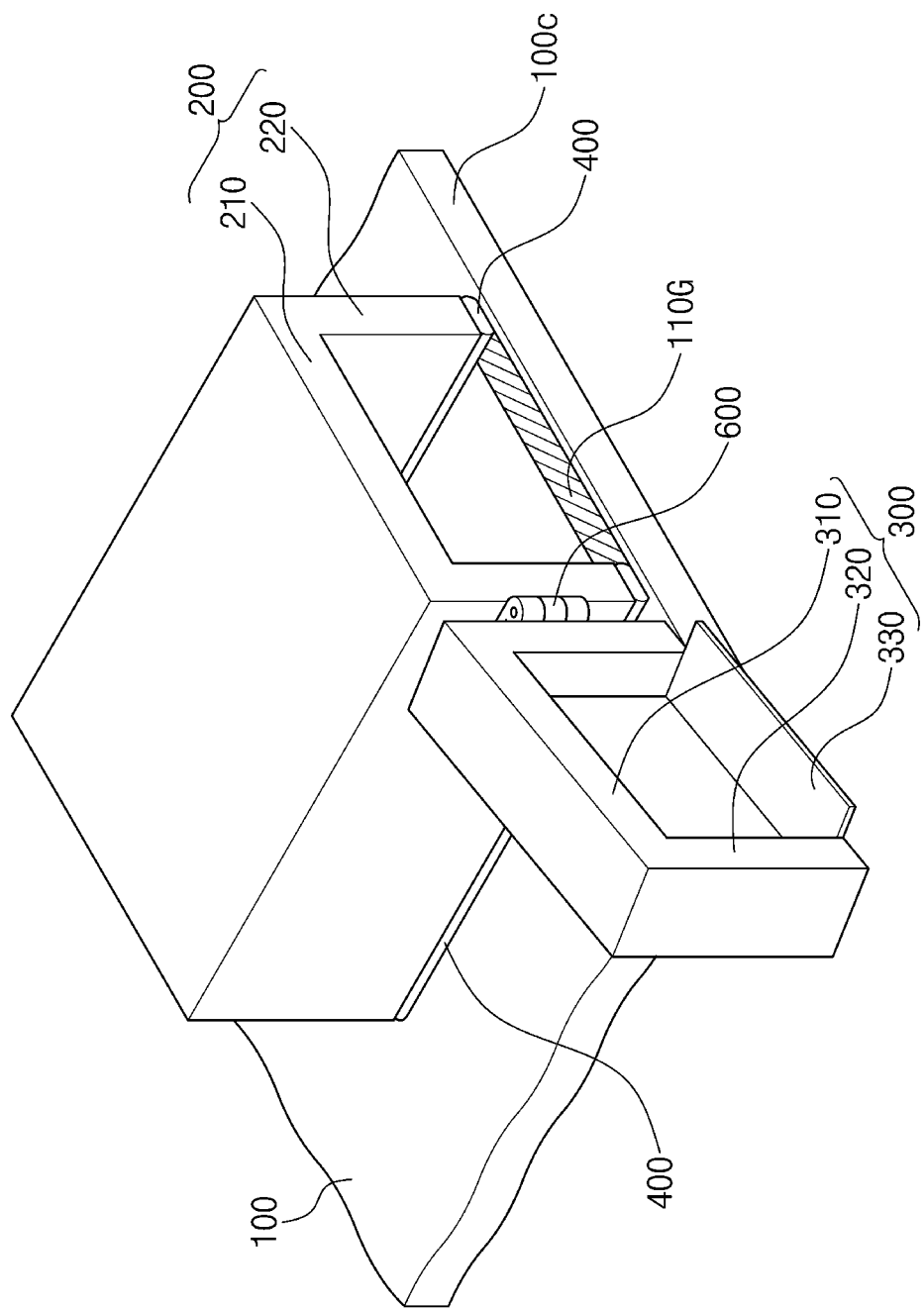
FIG. 6B illustrates a perspective view showing an electronic apparatus whose conductive cover is located at a first position according to some example embodiments.
Figure 6C:
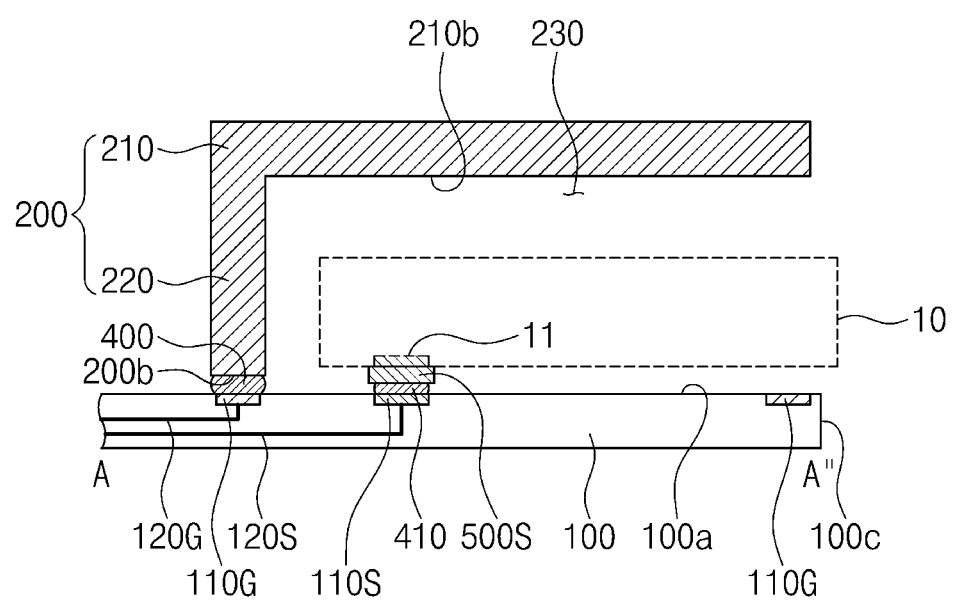
FIG. 6C illustrates a cross-sectional view taken along line A-A" of FIG. 6A, showing an electronic apparatus whose conductive cover is located at a first position according to some example embodiments.
Figure 6D:
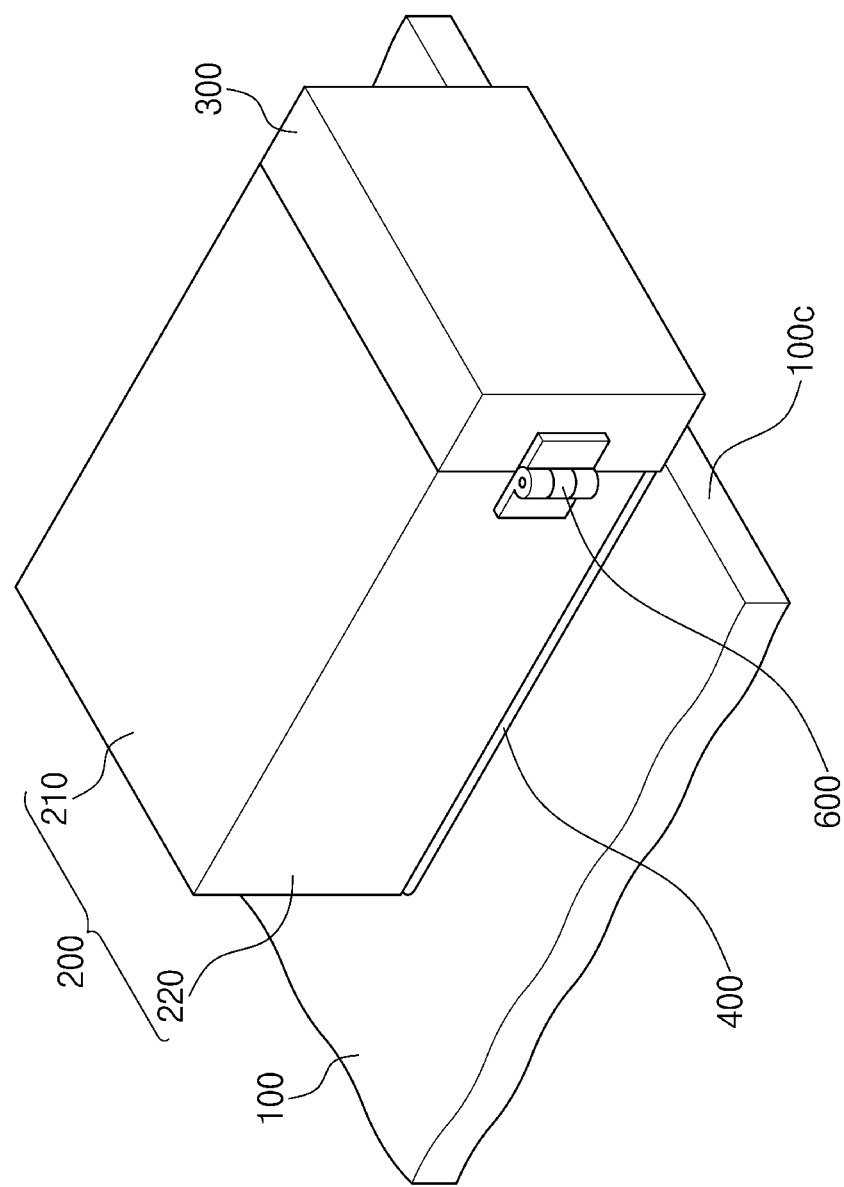
FIG. 6D illustrates a perspective view showing an electronic apparatus whose conductive cover is located at a second position according to some example embodiments.
Figure 6E:
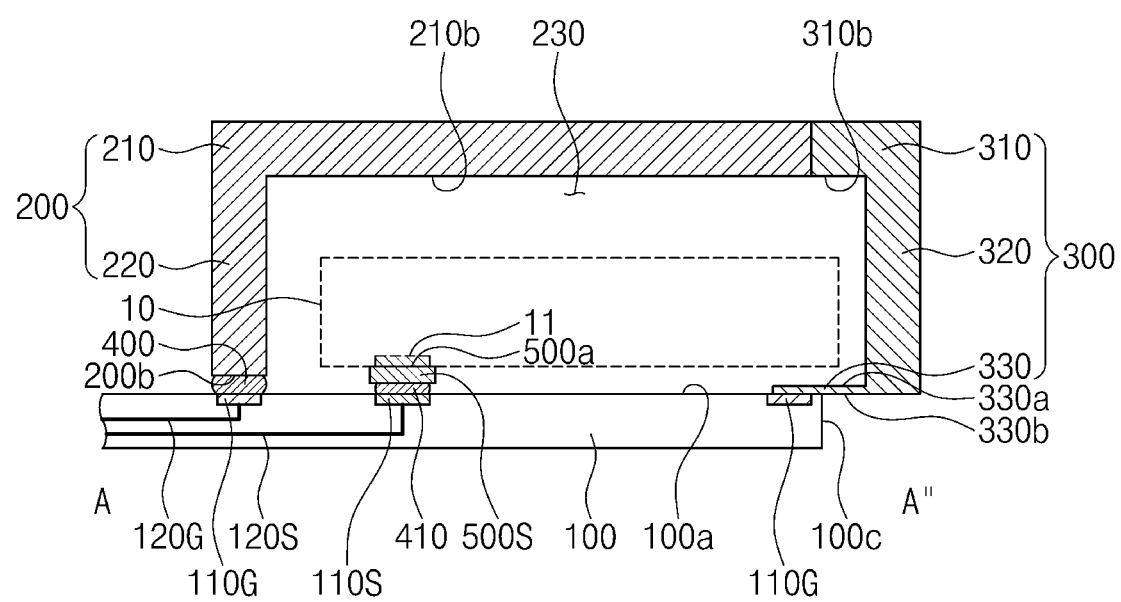
FIG. 6E illustrates a cross-sectional view taken along line A-A" of FIG. 6A, showing an electronic apparatus whose conductive cover is located at a second position according to some example embodiments.

FIG. 6A illustrates a plan view showing an electronic apparatus whose conductive cover is located at a second position according to some example embodiments. FIG. 6B illustrates a perspective view showing an electronic apparatus whose conductive cover is located at a first position according to some example embodiments. FIG. 6C illustrates a cross-sectional view taken along line A-A" of FIG. 6A. FIG. 6D illustrates a perspective view showing an electronic apparatus whose conductive cover is located at a second position according to some example embodiments. FIG. 6E illustrates a cross-sectional view taken along line A-A" of FIG. 6A, showing an electronic apparatus whose conductive cover is located at a second position according to some example embodiments. Duplicate description will be omitted below, and FIGS. 5C and 5D will also be referenced in explaining the following embodiment. In FIGS. 6A, 6C, and 6E, a dotted line virtually represents an inserted memory card.

Referring to FIGS. 6A, 6B, 6C, 6D, and 6E, an electronic apparatus may be a memory card socket. The electronic apparatus may include a substrate 100, a connection terminal 500S, a conductive housing 200, a conductive connector 400, and a conductive cover 300. The substrate 100 may have a top surface 100a, a bottom surface, and a first sidewall 100c. The bottom surface of the substrate 100 may face away from the top surface 100a. The first sidewall 100c may connect an edge of the top surface 100a to an edge of the bottom surface of the substrate 100.

The conductive housing 200 may be disposed adjacent to the first sidewall 100c of the substrate 100. The conductive housing 200 may be placed to allow the insertion space 230 to open to the first sidewall 100c of the substrate 100. For example, when viewed in a plan view as shown in FIG. 6A, an interval between the third supporting portion 223 of the conductive housing 200 and the first sidewall 100c of the substrate 100 may be greater than an interval between the first supporting portion 221 of the conductive housing 200 and the first sidewall 100c of the substrate 100 and greater than an interval between the second supporting portion 222 of the conductive housing 200 and the first sidewall 100c of the substrate 100.

As shown in FIG. 6E, the conductive cover 300 may include an upper part 310, a middle part 320, and a lower part 330. The upper part 310 of the conductive cover 300 may have a first bottom surface 310b and a first top surface that face away from each other. The first bottom surface 310b may be parallel to a first direction. The first direction may be parallel to the top surface 100a of the substrate 100. The lower part 330 of the conductive cover 300 may have a second bottom surface 330b and a second top surface 330a that face away from each other. The second top surface 330a may face the first bottom surface 310b and may be parallel to the first direction. Differently from that shown, the upper part 310 may be omitted from the conductive cover 300. In this case, the second top surface 330a of the lower part 330 of the conductive cover 300 may face the bottom surface 210b of the body portion 210 of the conductive housing 200. The middle part 320 of the conductive cover 300 may be provided between the upper part 310 and the lower part 330, and may connect an edge of the upper part 310 to an edge of the lower part 330. For example, the conductive cover 300 may be configured such that the middle part 320 is connected to the upper part 310 and the lower part 330 without boundaries therebetween.

With reference to FIGS. 6B and 6C, the conductive cover 300 may be located at a first position, and the insertion space 230 may be externally opened. The memory card 10 may be inserted into the insertion space 230. When the insertion of the memory card 10 is completed as shown in FIGS. 6A, 6C, and 6D, a portion of the memory card 10 may be disposed outside the first sidewall 100c of the substrate 100, when viewed in a plan view. When viewed in a plan view, the portion of the memory card 10 may not overlap the substrate 100. The conductive cover 300 may move from the first position to a second position, such that the insertion space 230 may be closed as shown in FIGS. 6D and 6E. When the conductive cover 300 is located at the second position, a bottom surface of the conductive cover 300 may be placed at a lower level than that of the bottom surface 200b of the conductive housing 200. The bottom surface of the conductive cover 300 may correspond to the second bottom surface 330b of the lower part 330 of the conductive cover 300. Therefore, the conductive cover 300 at the second position may be electrically connected to the ground pattern 110G. For example, the second bottom surface 330b of the lower part 330 of the conductive cover 300 may contact the ground pattern 110G. The memory card 10 may operate in a state the conductive cover 300 is located at the second position, and may thus be efficiently shielded from electromagnetic interference. When the conductive cover 300 is located at the second position, the second top surface 330a of the lower part 330 of the conductive cover 300 may be placed at a lower level than that of a top surface 500a of the connection terminal 500S. Thus, even when the memory card 10 is inserted, the conductive cover 300 may be spaced apart from the memory card 10.

As shown in FIG. 6D, a hinge 600 may couple the conductive cover 300 to the conductive housing 200. The hinge 600 may be disposed on an outer sidewall of the supporting portion 220 of the conductive housing 200 and may extend onto an outer sidewall of the conductive cover 300. Alternatively, as shown in FIGS. 3A and 5A, the hinge 600 may be disposed on a top surface of the conductive housing 200 and may extend onto either an outer sidewall or a top surface of the conductive cover 300.

The substrate 100, the connection terminal 500S, and the conductive housing 200 may be the same as those discussed above.

Figure 7A:
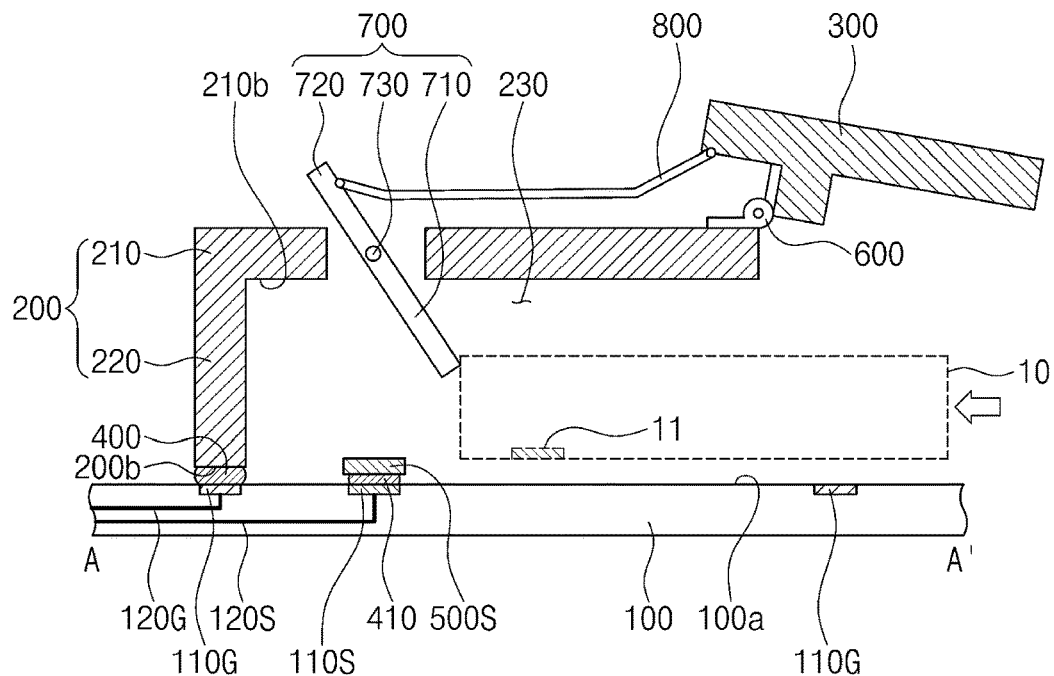
FIG. 7A illustrates a cross-sectional view showing an electronic apparatus whose conductive cover is located at a first position according to some example embodiments.
Figure 7B:
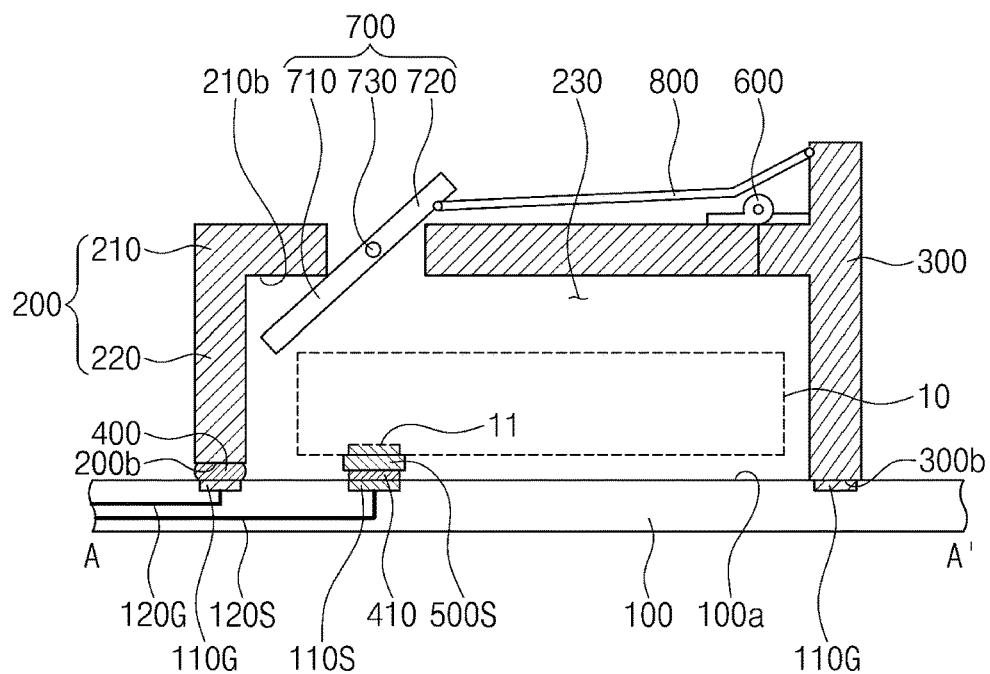
FIG. 7B illustrates a cross-sectional view showing an electronic apparatus whose conductive cover is located at a second position according to some example embodiments.
Figure 7C:
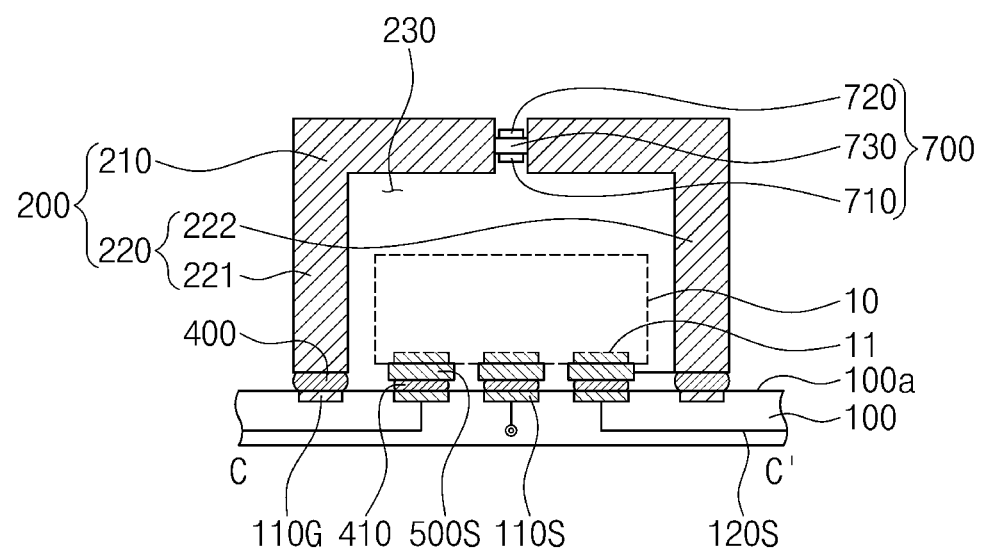
FIG. 7C illustrates a cross-sectional view taken along line C-C' of FIG. 1, showing an electronic apparatus whose conductive cover is located at a second position according to some example embodiments.

FIG. 7A illustrates a cross-sectional view taken along line A-A' of FIG. 1, showing an electronic apparatus whose conductive cover is located at a first position according to some example embodiments. FIG. 7B illustrates a cross-sectional view taken along line A-A' of FIG. 1, showing an electronic apparatus whose conductive cover is located at a second position according to some example embodiments. FIG. 7C illustrates a cross-sectional view taken along line C-C' of FIG. 1, showing an electronic apparatus whose conductive cover is located at a second position according to some example embodiments. Duplicate description will be omitted below, and FIGS. 3B, 5B, and 5D will also be referenced in explaining the following embodiment. In FIGS. 7A, 7B, and 7C, a dotted line virtually represents an inserted memory card.

Referring to FIGS. 7A, 7B, and 7C, an electronic apparatus may include a substrate 100, a connection terminal 500S, a conductive housing 200, a conductive connector 400, and a conductive cover 300, and may further include a manipulator 700 and an operation transmission 800. As the electronic apparatus includes the manipulator 700 and the operation transmission 800, the electronic apparatus may automatically move the conductive cover 300.

The manipulator 700 may be coupled to the conductive housing 200. For example, a lever may be used as the manipulator 700. The manipulator 700 may include a first manipulator 710, a second manipulator 720, and a fixed shaft 730. The fixed shaft 730 may be provided within the conductive housing 200, between the first manipulator 710 and the second manipulator 720. As shown in FIG. 7C, the fixed shaft 730 may have distal ends coupled to the conductive housing 200. The fixed shaft 730 may fix the first manipulator 710 and the second manipulator 720 to the conductive housing 200. As shown in FIG. 7A, the first manipulator 710 may be provided inside the insertion space 230 of the conductive housing 200. For example, at least a portion of the first manipulator 710 may be placed at a lower level than that of the bottom surface 210b of the body portion 210. The second manipulator 720 may be provided outside the conductive housing 200. For example, at least a portion of the second manipulator 720 may be provided on a top surface of the body portion 210. In another example, the second manipulator 720 may be disposed on an outer sidewall of the conductive housing 200.

The operation transmission 800 may be connected to the second manipulator 720 and the conductive cover 300. The operation transmission 800 may provide the conductive cover 300 with operation or force generated from the manipulator 700. The operation transmission 800 may include a wire or a rod.

As shown in FIG. 7A, the conductive cover 300 may be located at a first position, and the insertion space 230 may be externally opened. The conductive cover 300 may be spaced apart from the ground pattern 110G, but embodiments of the present disclosure are not limited thereto. When the memory card 10 is provided with force (e.g., applied by a user) as shown with arrow, the memory card 10 may be inserted into the insertion space 230. During the insertion of the memory card 10, a distal end of the memory card 10 may contact the first manipulator 710. The force (e.g., applied by a user) may be transferred to the first manipulator 710, and then the first manipulator 710 may change in position. A force generated from the movement of the first manipulator 710 may be transferred to the second manipulator 720 and the operation transmission 800. The conductive cover 300 may thus move from the first position to a second position, and accordingly the insertion space 230 may be closed as shown in FIG. 7B. The conductive cover 300 at the second position may be electrically connected to the ground pattern 110G. For example, the bottom surface 300b of the conductive cover 300 may contact the ground pattern 110G. The memory card 10 may operate in a state where the conductive cover 300 is located at the second position.

When the memory card 10 completes its operation, the second manipulator 720 may be provided with force (e.g., applied by a user). The force (e.g., applied by a user) may drive the second manipulator 720 to change its position. The force (e.g., applied by a user) may be transferred through the operation transmission 800 to the conductive cover 300. The conductive cover 300 may thus move from the second position to the first position, and accordingly the insertion space 230 may be opened as shown in FIG. 7A. In addition, a force generated from the movement of the second manipulator 720 may be transferred to the first manipulator 710. The first manipulator 710 may push the memory card 10 to depart the card terminal 11 of the memory card 10 from the connection terminal 500S. The memory card 10 may be unloaded.

In another example, when the memory card 10 completes its operation, the conductive cover 300 may be provided with force (e.g., applied by a user) and thus may move from the second position to the first position, with the result that the insertion space 230 may be opened. The force (e.g., applied by a user) may be transferred to the first manipulator 710 through the operation transmission 800 and the second manipulator 720. The first manipulator 710 may push and unload the memory card 10.

According to an embodiment of the present disclosure, an electronic apparatus may include a conductive housing and a conductive cover. When a memory card is inserted into the electronic apparatus, the conductive housing and the conductive cover may be disposed to enclose the memory card.

A ground voltage may be applied to the conductive housing and the memory card. Accordingly, the memory card may have improved characteristics of electromagnetic interference shield. The memory card and the electronic apparatus may increase in reliability of operation.

The present disclosure should not be construed as limited to the embodiments explicitly set forth herein, and it is intended that embodiments of the present disclosure cover the various combinations, modifications, and variations of the present disclosure without departing from the spirit and scope of the present disclosure. The appended claims should be construed to include other embodiments.

What is claimed is:

1. An electronic apparatus, comprising:
    a substrate having a ground pattern on a top surface of the substrate;
    a conductive housing on the ground pattern and having an insertion space;
    a conductive connector disposed between the ground pattern and the conductive housing and connected to the ground pattern and the conductive housing, wherein the conductive housing is fixed to the substrate via the conductive connector; and
    a conductive cover coupled to the conductive housing,
    wherein the conductive cover is configured to move from a first position, at which the conductive cover externally opens the insertion space, to a second position, at which the conductive cover closes the insertion space, and
    wherein the conductive cover, while at the second position, is in contact with a portion of the ground pattern.

2. The electronic apparatus of claim 1, wherein the conductive connector is in contact with a bottom surface of the conductive housing and with a top surface of the ground pattern.

3. The electronic apparatus of claim 1, wherein the conductive connector comprises a solder material.

4. The electronic apparatus of claim 1, wherein, when viewed in a plan view, the ground pattern has a closed loop shape.

5. The electronic apparatus of claim 1, wherein the conductive cover, while at the first position, is spaced apart from the portion of the ground pattern.

6. The electronic apparatus of claim 1, wherein the conductive housing comprises:
    a body portion; and
    a supporting portion between the ground pattern and an edge region of the body portion, the supporting portion connected to the body portion,
    wherein the insertion space is defined by the top surface of the substrate, an inner sidewall of the supporting portion, and a bottom surface of the body portion.

7. The electronic apparatus of claim 1, further comprising a connection terminal on the top surface of the substrate, the connection terminal exposed to the insertion space,
    wherein the conductive housing and the conductive cover are insulated from the connection terminal.

8. The electronic apparatus of claim 7, wherein the conductive cover comprises an upper part, a lower part, and a middle part,
    wherein the middle part connects the upper part and the lower part to each other,
    wherein a top surface of the lower part of the conductive cover is parallel to the top surface of the substrate and faces either the conductive housing or the upper part of the conductive cover, and
    wherein the top surface of the lower part of the conductive cover is at a level lower than a level of a top surface of the connection terminal when the conductive cover is at the second position.

9. The electronic apparatus of claim 1, further comprising a hinge coupled to the conductive housing and the conductive cover.

10. The electronic apparatus of claim 1, further comprising:
    a manipulator coupled to the conductive housing, the manipulator comprising a lever; and
    an operation transmission coupled to the manipulator and the conductive cover.

11. The electronic apparatus of claim 10, wherein the lever comprises:
    a first manipulator inside the insertion space;
    a second manipulator outside the conductive housing; and
    a fixed shaft between the first manipulator and the second manipulator, wherein the fixed shaft fixes the first manipulator and the second manipulator to the conductive housing.

12. A memory card socket, comprising:
    a substrate including a ground pattern that comprises a first part and a second part;
    a conductive housing on the substrate and having an insertion space;
    a conductive connector between a top surface of the first part of the ground pattern and a bottom surface of the conductive housing, the conductive connector coupled to the first part of the ground pattern and the bottom surface of the conductive housing; and
    a conductive cover coupled to the conductive housing,
    wherein the conductive cover is configured to move from a first position to a second position, at which the conductive cover closes the insertion space, the second position being different from the first position, and
    wherein the conductive connector comprises a solder material.

13. The memory card socket of claim 12, wherein
    the conductive cover, while at the first position, externally opens the insertion space and is spaced apart from the second part of the ground pattern, and
    the conductive cover, while at the second position, is in contact with the second part of the ground pattern.

14. The memory card socket of claim 13, wherein a bottom surface of the conductive cover, while the conductive cover is at the second position, is at a level lower than a level of the bottom surface of the conductive housing.

15. The memory card socket of claim 14, wherein a difference in level between the bottom surface of the conductive cover at the second position and the bottom surface of the conductive housing is in a range of 0.0001 mm to 0.1 mm.

16. The memory card socket of claim 12, further comprising a hinge coupled to the conductive housing and the conductive cover.

17. A memory card socket, comprising:
    a substrate including a ground pattern on a top surface of the substrate;
    a conductive housing on the ground pattern and having an insertion space;
    a conductive connector provided between the ground pattern and the conductive housing and electrically connected to the ground pattern and the conductive housing;
    a conductive cover;

a hinge coupled to the conductive housing and the conductive cover; and a connection terminal on the top surface of the substrate and exposed to the insertion space, wherein the connection terminal is electrically insulated from the ground pattern, wherein the conductive housing comprises a body portion and a supporting portion, the supporting portion between the body portion and the substrate, wherein the conductive connector is in contact with a bottom surface of the supporting portion, wherein the conductive cover is configured to move between:

a first position at which the conductive cover externally opens the insertion space; and a second position at which the conductive cover closes the insertion space, and wherein the conductive cover, while at the second position, is in contact with a portion of the ground pattern.

18. The memory card socket of claim 17, wherein the conductive connector comprises a solder material.

19. The memory card socket of claim 17, wherein the supporting portion comprises:

a first supporting portion comprising a first inner sidewall;

a second supporting portion comprising a second inner sidewall that faces the first inner sidewall; and a third supporting portion comprising a third inner sidewall that neighbors the first inner sidewall and the second inner sidewall, wherein, in a plan view, each of the first supporting portion, the second supporting portion, and the third supporting portion overlaps the ground pattern and is fixed to the substrate.

\* \* \* \* \*